US011217692B2

(12) United States Patent
Waskiewicz et al.

(10) Patent No.: US 11,217,692 B2
(45) Date of Patent: Jan. 4, 2022

(54) VERTICAL FIELD EFFECT TRANSISTOR WITH BOTTOM SPACER

(71) Applicant: International Business Machines Corporation, Armonk, NY (US)

(72) Inventors: Christopher J. Waskiewicz, Rexford, NY (US); Ruilong Xie, Niskayuna, NY (US); Jay William Strane, Warwick, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 16/738,152

(22) Filed: Jan. 9, 2020

(65) Prior Publication Data

US 2021/0217889 A1 Jul. 15, 2021

(51) Int. Cl.
  *H01L 29/78* (2006.01)
  *H01L 29/06* (2006.01)
  *H01L 29/66* (2006.01)
  *H01L 29/417* (2006.01)

(52) U.S. Cl.
  CPC ...... *H01L 29/7827* (2013.01); *H01L 29/0653* (2013.01); *H01L 29/41791* (2013.01); *H01L 29/66666* (2013.01); *H01L 29/66795* (2013.01); *H01L 29/785* (2013.01)

(58) Field of Classification Search
  CPC ............. H01L 29/7827; H01L 29/0653; H01L 29/785; H01L 29/66666; H01L 29/66795; H01L 29/41791; H01L 29/42376

USPC ........................................................ 257/365
See application file for complete search history.

(56) References Cited

U.S. PATENT DOCUMENTS

| | | | |
|---|---|---|---|
| 8,637,849 | B2 | 1/2014 | Deligianni et al. |
| 9,287,362 | B1 | 3/2016 | Basu et al. |
| 9,437,503 | B1 | 9/2016 | Mallela et al. |
| 9,691,850 | B2 | 6/2017 | Cheng et al. |
| 9,716,170 | B1 | 7/2017 | Cheng et al. |
| 9,741,626 | B1 | 8/2017 | Cheng et al. |
| 9,853,028 | B1 | 12/2017 | Cheng et al. |
| 9,853,127 | B1 * | 12/2017 | Anderson ....... H01L 21/823425 |
| 9,882,025 | B1 * | 1/2018 | Zhang ................ H01L 29/7827 |
| 9,954,103 | B1 | 4/2018 | Gluschenkov et al. |
| 10,043,874 | B2 | 8/2018 | Cheng et al. |

(Continued)

*Primary Examiner* — Mohammad M Hoque
(74) *Attorney, Agent, or Firm* — Robert Sullivan; Ryan, Mason & Lewis, LLP

(57) ABSTRACT

A semiconductor device includes a substrate, at least one semiconductor vertical fin extending from the substrate, a bottom source/drain region disposed beneath the at least one semiconductor vertical fin, and first and second isolation regions on respective longitudinal sides of the semiconductor vertical fin. Each of the first and second isolation regions extend vertically above the bottom source/drain region. A bottom spacer is disposed on the first and second isolation regions. A spacer segment of the bottom spacer is disposed on a first upper surface portion of the bottom source/drain region adjacent the first isolation region. A dielectric liner underlies at least portions of the first and second isolation regions. A dielectric segment of the dielectric liner is disposed on a second upper surface portion of the bottom source/drain region adjacent the second isolation region. At least one functional gate structure is disposed on the semiconductor vertical fin.

20 Claims, 10 Drawing Sheets

(56) References Cited

U.S. PATENT DOCUMENTS

| | | |
|---|---|---|
| 10,083,871 B2 | 9/2018 | Cheng et al. |
| 10,211,315 B2 | 2/2019 | Zang et al. |
| 2019/0140080 A1 | 5/2019 | Lee et al. |

* cited by examiner

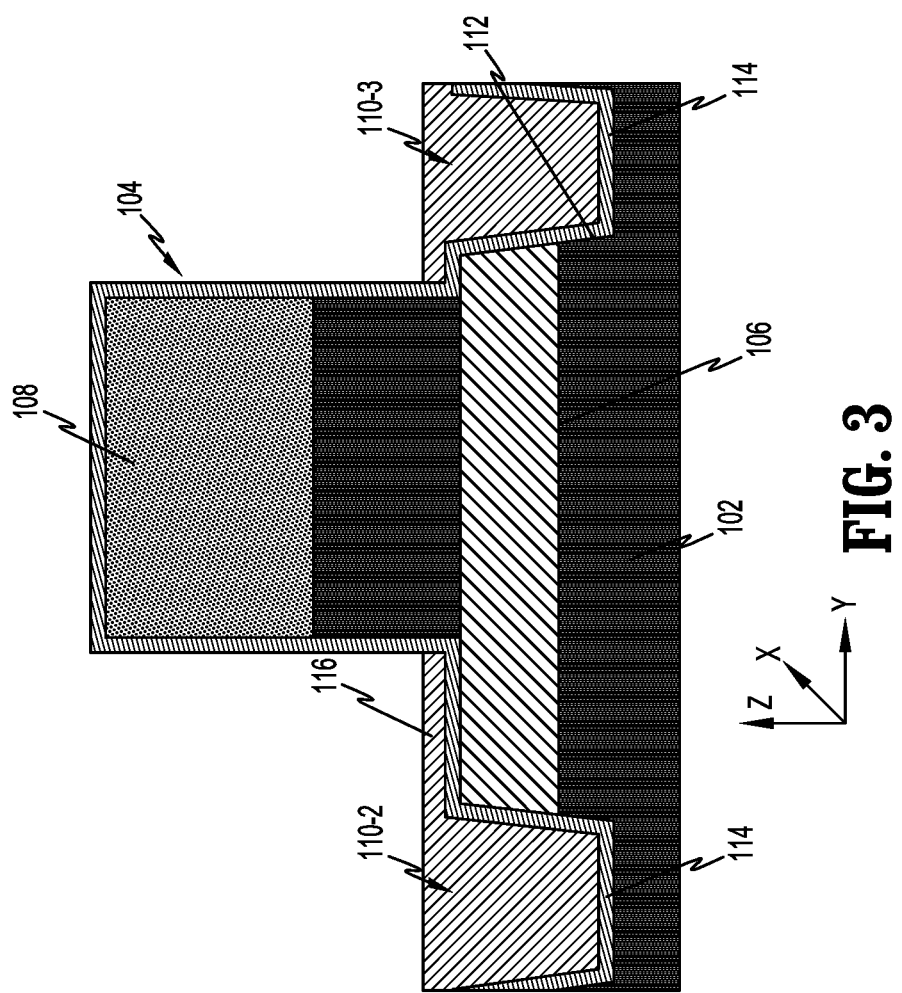
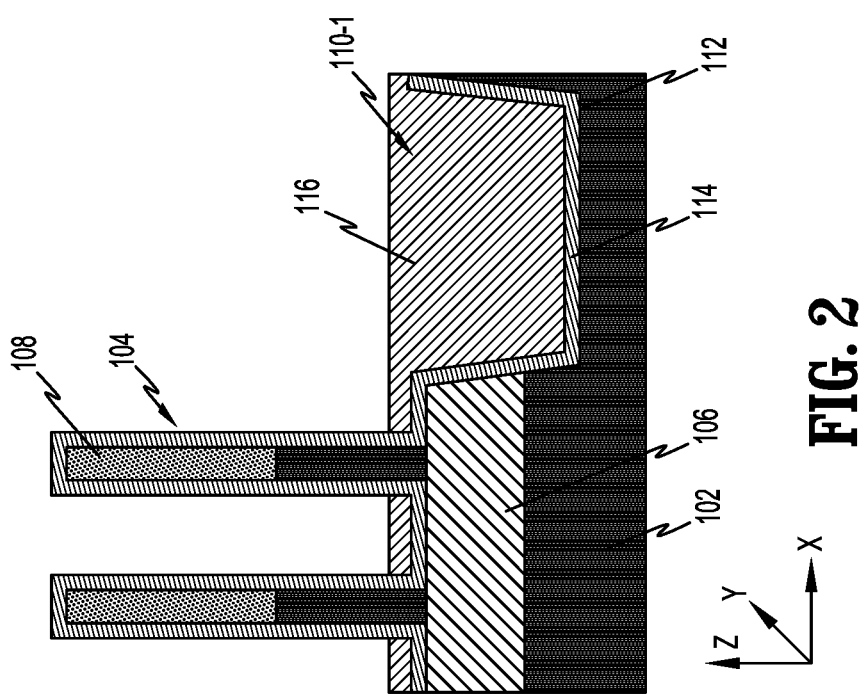

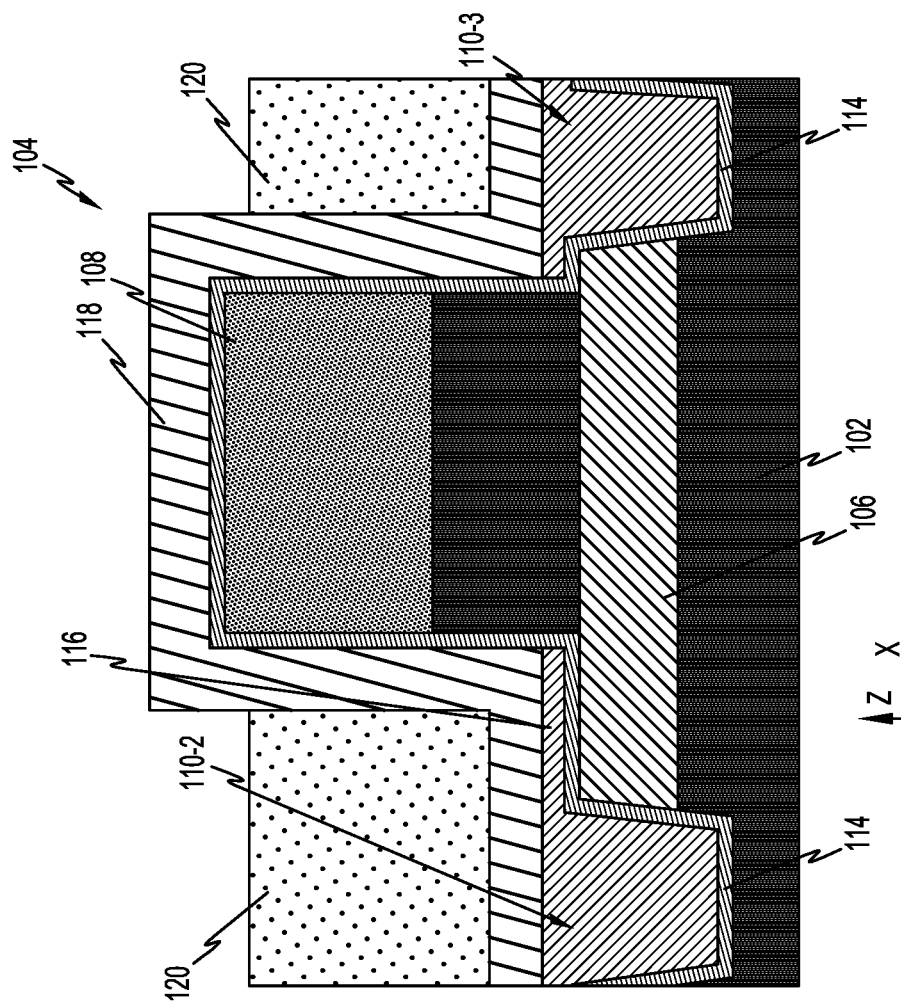
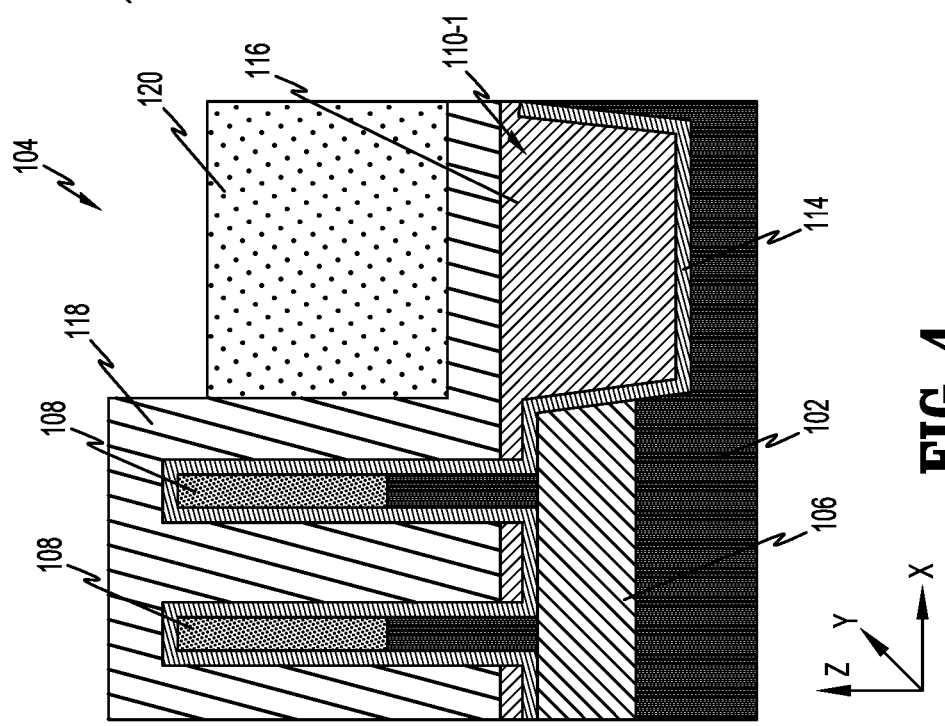
FIG. 5
FIG. 4

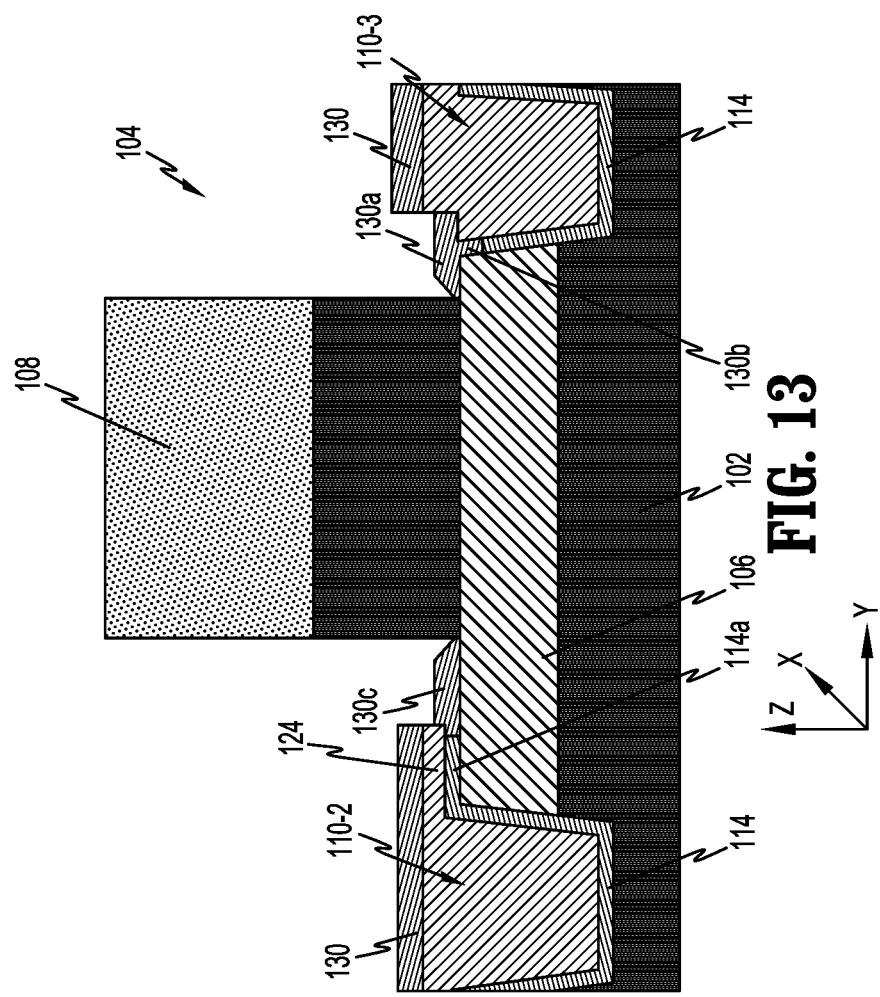
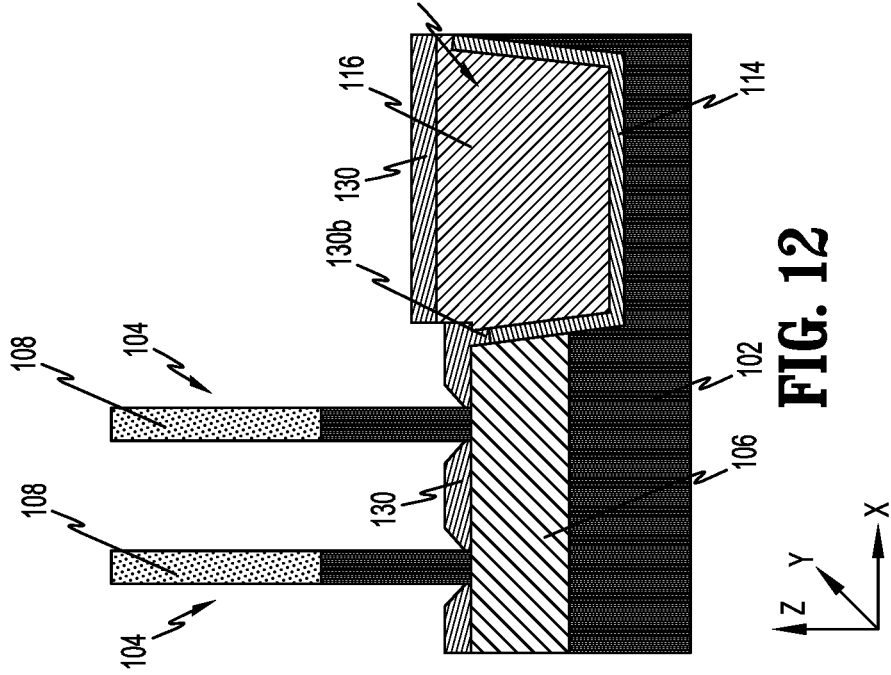
FIG. 13
FIG. 12

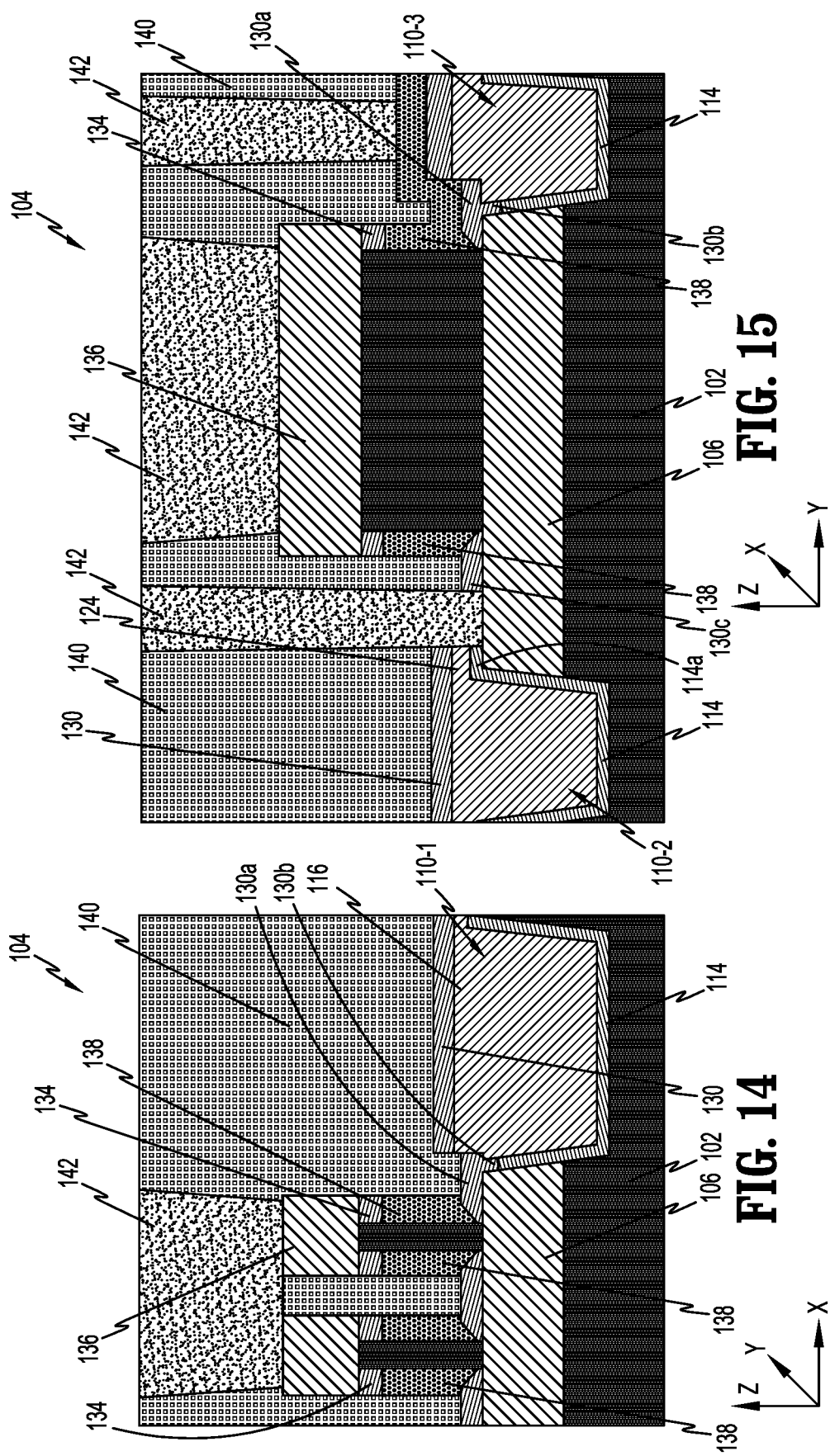

VERTICAL FIELD EFFECT TRANSISTOR WITH BOTTOM SPACER

BACKGROUND

The present disclosure relates to semiconductor devices, and more specifically, to a vertical field effect transistor (VFET).

Vertical field effect transistors (VFET) are semiconductor devices where the source-drain current flows in a direction normal, i.e., vertical, to the substrate surface. In a VFET, a vertical semiconductor pillar defines the channel region with the source and drain regions located at opposing ends of the semiconductor pillar. One advantage of a vertical transistor is that the source, drain and channel regions are stacked vertically in a single footprint, which could be beneficial in area scaling of integrated circuits. Accordingly, VFETs are an attractive option for technology scaling for 5 nm and beyond. However, fabrication of VFETs can present issues involving exposure of the channel regions and build-up of residual high-k gate material particularly adjacent the bottom spacer area.

SUMMARY

Illustrative embodiments comprise a semiconductor device and a method for fabricating a semiconductor device. In one illustrative embodiment, a semiconductor device comprises a substrate defining a longitudinal axis and a vertical axis orthogonal to the longitudinal axis, at least one semiconductor vertical fin extending from the substrate, a bottom source/drain region disposed beneath the at least one semiconductor vertical fin and first and second isolation regions on respective longitudinal sides of the semiconductor vertical fin. Each of the first and second isolation regions extend vertically above the bottom source/drain region. The semiconductor device further comprises a bottom spacer disposed on the first and second isolation regions. A spacer segment of the bottom spacer is disposed on a first upper surface portion of the bottom source/drain region adjacent the first isolation region. A dielectric liner underlies at least portions of the first and second isolation regions. A liner segment of the dielectric liner is disposed on a second upper surface portion of the bottom source/drain region adjacent the second isolation region. A functional gate structure is located on each longitudinal side of the semiconductor vertical fin.

In another illustrative embodiment, a method comprises forming at least one semiconductor vertical fin on a semiconductor structure, forming first and second isolation regions adjacent respective opposed longitudinal ends of the semiconductor vertical fin, forming a recessed segment in the first isolation region adjacent one longitudinal end of the semiconductor vertical fin, forming a bottom source/drain region within the substrate beneath the semiconductor vertical fin, forming a first top source/drain region on the semiconductor vertical fin, and forming a bottom spacer on the first and second isolation regions and upper surface portions of the bottom source/drain region. A spacer segment of the bottom spacer is at least partially accommodated within the recessed segment of the first isolation region and extends onto the bottom source/drain region. The method further comprises forming a functional metal gate structure about the semiconductor vertical fin.

In yet another illustrative embodiment, a method comprises forming a semiconductor vertical fin on a substrate, forming first and second trenches within the substrate adjacent respective opposed longitudinal ends of the semiconductor fin, forming a bottom source/drain region beneath the vertical semiconductor fin, forming a dielectric liner within the trenches and onto at least surface portions of the bottom source/drain region, and depositing a dielectric fill within each of the first and second trenches and onto the dielectric liner. The dielectric fill extends vertically above the bottom source/drain region. The method further comprises forming a bottom spacer on the dielectric fill, at least partially covering a first longitudinal end of the bottom source/drain region with a spacer segment of the bottom spacer, at least partially covering a second longitudinal end of the bottom source/drain region with a liner segment of the dielectric liner, forming a first top source/drain region on the semiconductor vertical fin and forming at least one functional metal gate structure about the semiconductor vertical fin.

These and other objects, features and advantages of the present disclosure will become apparent from the following detailed description of illustrative embodiments thereof, which is to be read in connection with the accompanying drawings.

BRIEF DESCRIPTION OF THE DRAWINGS

FIG. 2 is a cross-sectional view along the x-axis of FIG. 1 illustrating the semiconductor structure including the substrate and the first pair of semiconductor vertical fins extending from the substrate at a first intermediate stage of fabrication of the semiconductor structure according to one or more illustrative embodiments.

FIG. 3 is a cross-sectional view along the y-axis of FIG. 1 illustrating the semiconductor structure and an individual semiconductor vertical fin of the second pair of semiconductor vertical fins extending from the substrate at the first intermediate stage of fabrication of the semiconductor structure according to one or more illustrative embodiments.

FIG. 4 is a cross-sectional view along the x-axis of the semiconductor structure at a second intermediate stage of fabrication of the semiconductor structure according to one or more illustrative embodiments.

FIG. 5 is a cross-sectional view along the y-axis of the semiconductor structure at the second intermediate stage of fabrication of the semiconductor structure according to one or more illustrative embodiments.

FIG. 12 is a cross-sectional view along the x-axis of the semiconductor structure at an eighth intermediate stage of fabrication of the semiconductor structure according to one or more illustrative embodiments.

FIG. 13 is a cross-sectional view along the y-axis of the semiconductor structure at the eighth intermediate stage of fabrication according to one or more illustrative embodiments.

FIG. 14 is a cross-sectional view along the x-axis of the semiconductor structure at a ninth stage of fabrication of the semiconductor structure according to one or more illustrative embodiments.

FIG. 15 is a cross-sectional view along they axis of the semiconductor structure at the ninth stage of fabrication of the semiconductor structure according to one or more illustrative embodiments.

DETAILED DESCRIPTION

Figure 1:
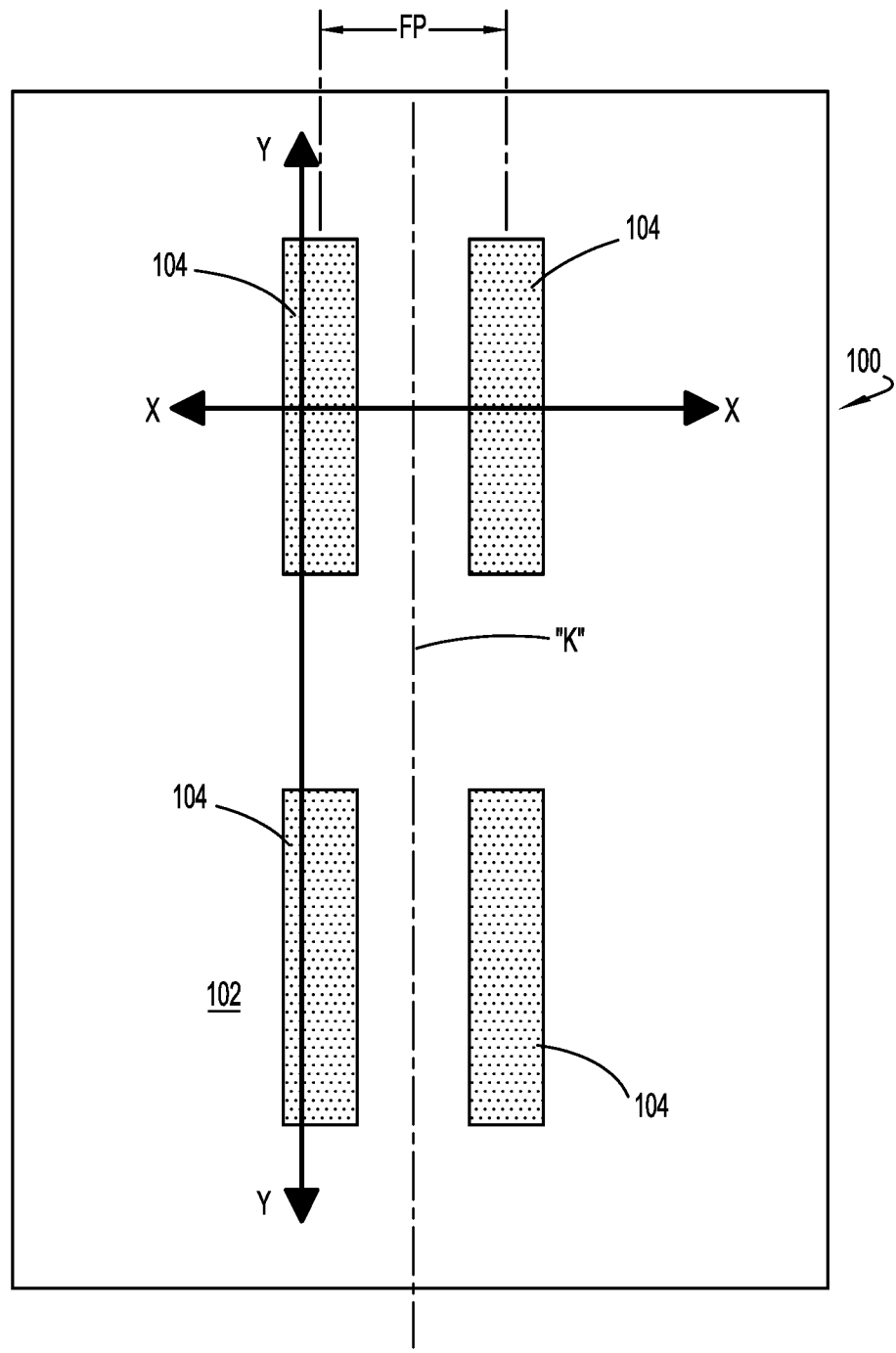
FIG. 1 is a top plan schematic view of a semiconductor structure illustrating the substrate and first and second pairs of semiconductor vertical fins extending upwardly from the substrate at an early stage of fabrication of the semiconductor structure according to one or more illustrative embodiments.

In illustrative embodiments, a VFET device is fabricated via a methodology which minimizes the potential of high-k gate material exposure and reduces parasitic capacitance. In one or more illustrative embodiments, a VFET fabrication process produces a bottom spacer and one or more raised isolation regions which effectively isolates the bottom source/drain region from the high-k metal gate material thereby enhancing the functionality of the VFET device while also addressing reduced dimensional concerns.

Illustrative embodiments of the disclosure will now be described with regard to methods for fabricating semiconductor substrates as well as semiconductor devices comprising one or more VFETs with uniform structural profiles. Semiconductor fabrication methods for VFETs according to illustrative embodiments implement a process flow to fabricate a bottom spacer and raised isolation regions. As explained in further detail below, an illustrative process creates a VFET device with heightened isolation regions and associated bottom spacers to provide functional gate structures with enhanced effectiveness and reduced potential for shorting due to high-k residual metal gate material build-up.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure is not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a VFET device according to illustrative embodiments utilize a variety of individually known physical and chemical processes performed on a semiconductor (e.g., silicon) substrate, some of which are described in the immediately following paragraphs.

As previously discussed, VFET devices have been developed to achieve a reduced FET device footprint without compromising FET device performance characteristics. A vertical FET has a channel perpendicular to the substrate surface as opposed to a conventional FET, which has a channel extending substantially parallel to the substrate surface. Forming the bottom spacer of a vertical FET by directional deposition techniques (e.g., high-density plasma deposition (HDP), physical vapor deposition (PVD), or gas clustering ion beam deposition (GCIB), etc.) can be problematic due a variety of reasons including, for example, semiconductor vertical fin height variation, inconsistencies or changes in reveal depth of the shallow trench isolation (STI) between one or more fins, and loading effects. Furthermore, directional deposition of the bottom spacer may still result in exposure of the channel region of the VFET and undesired build-up of residual high-k metal gate material, which would have a deleterious effect on the functioning of the VFET device. Accordingly, illustrative embodiments of the present disclosure are directed to formation of a bottom spacer and a shallow trench isolation (STI) region for a VFET device, which addresses the aforementioned issues and concerns of current FET architectures.

In the discussion that follows, the semiconductor structure, which will incorporate one or more VFET devices, will be referred to as the "semiconductor structure 100" throughout the various stages of fabrication, as represented in all the accompanying drawings.

Methods for fabricating a semiconductor structure 100 comprising one or more VFET devices will now be discussed in further detail with reference to FIGS. 1 through 15, which schematically illustrate a semiconductor structure 100 incorporating one or more VFET devices at various stages of fabrication. With initial reference to FIG. 1, there is schematically illustrated, in a top plan view, a semiconductor structure 100 at an early stage of fabrication. At this stage of fabrication, the semiconductor structure 100 includes a substrate 102 defining a longitudinal axis "K" along the y-axis and first and second pairs of semiconductor vertical fins 104 extending upwardly from the substrate 102. The semiconductor vertical fins 104 each define a longitudinal length along the y-axis which may or not be the same for each of the semiconductor vertical fins 104. Longitudinally adjacent semiconductor vertical fins 104 forming the pairs define a fin pitch "FP'" which is the distance between the centers of the longitudinally adjacent semiconductor vertical fins 104. The fin pitch may range from 28 to 60 nanometers (nm) or about 36 nm.

With reference now to FIGS. 2 and 3, which are cross-sectional views of the semiconductor structure 100 along the x-axis and y-axis of FIG. 1, respectively, the semiconductor structure 100 is illustrated at an intermediate stage of fabrication where several processes have been previously performed. FIG. 2, and some of the similar views that follow, is a cross-sectional view taken along the x-axis through a pair of two longitudinally adjacent fins 104. FIG. 3, and some of the similar views that follow, is a cross-sectional view taken along the y-axis. The cross-sectional view along the y-axis is through only one semiconductor vertical fin 104 and through surrounding areas of the semiconductor substrate 102. At this stage of fabrication depicted in FIGS. 2 and 3, the semiconductor structure 100 includes the substrate 102, the pairs of semiconductor vertical fins 104 extending upwardly from the substrate 102 and bottom source/drains region 106 disposed beneath the respective pairs of longitudinally adjacent semiconductor vertical fins 104. The bottom source/drain regions 106 may have either an n-type polarity or a p-type polarity depending on the architecture of the semiconductor structure 100.

The semiconductor substrate 102 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 102 may comprise an active semiconductor layer (e.g., silicon layer, SiGe layer, III-V compound semiconductor layer, etc.) of a SOI (silicon on insulator) substrate, which comprises an insulating layer (e.g., oxide layer) disposed between a base substrate layer (e.g., silicon substrate) and the active semiconductor substrate 102 in which active circuit components (e.g., VFET devices) are formed as part of a front-end-of-line (FEOL) layer.

The semiconductor vertical fins 104 are generally normal to, or perpendicular to, the substrate 102. Each of the semiconductor vertical fins 104 includes a fin cap 108 at an upper end thereof. In various embodiments, the semiconductor vertical fins 104 each may have a width along the x-axis in the range of about 4 nm to about 40 nm, or can have a width in the range of about 6 nm to about 15 nm. In various embodiments, the semiconductor vertical fins 104 may have a height along the z-axis in the range of about 20 nm to about 100 nm, or in the range of about 30 nm to about 60 nm. Other dimensions of the semiconductor vertical fins 104 are also contemplated. The semiconductor vertical fins 104 may be formed simultaneously with the substrate 102 during the same patterning process, such as, self-aligned double patterning or self-aligned quadruple patterning. The semiconductor vertical fins 104 may be formed, e.g., by removing material from the substrate 102 using a photolithography process followed by an anisotropic etching process such as reactive ion etching (RIE) or plasma etching. Other methods of forming the semiconductor vertical fins 104 known in the art may also be utilized, such as sidewall image transfer (SIT) process.

The fin cap 108 disposed on the top of each semiconductor vertical fin 104 may be formed of any suitable material, e.g., a silicon nitride (SiN) hard mask material, that has an etch resistance greater than that of the substrate 102 and at least some of the insulator materials used in the remainder of the processing of the semiconductor structure 100. The hard mask material forming the fin caps 108 is used to cover/protect the semiconductor vertical fins 104 during prior and subsequent etching processes. The hard mask material may be deposited on the semiconductor vertical fins 104 where excess hard mask material is etched away in an etching process leaving the fin caps 108 on the top of the semiconductor vertical fins 104.

In illustrative embodiments, the bottom/source drain regions 106 may be in-situ doped wherein dopants are incorporated into the bottom source/drain layers 106 during epitaxial growth of the bottom source/drain regions 106. For example, for n-type VFET devices, the bottom source/drain regions 106 may comprise a doped epitaxial silicon (Si) material, and for p-type VFET devices, the bottom source/drain regions 106 may comprise a doped epitaxial silicon-germanium (SiGe) layer. It is to be understood that the term "source/drain region" as used herein means that a given source/drain region can be either a source region or a drain region, depending on the application or circuit configuration.

In other illustrative embodiments, the bottom source/drain regions 106 may be formed via an ion implantation process(es). In one illustrative embodiment, the bottom source/drain regions 106 may comprise N-type dopant atoms or P-type dopant atoms, each formed by introducing dopant atoms during one or more ion implantation processes with the use of patterned implant masks (not shown). The implantation processes performed on the bottom/source drain regions 106 may occur before or after the formation of the semiconductor vertical fins 104.

As best depicted in FIG. 3, the bottom source/drain region 106 beneath the longitudinally adjacent pairs of semiconductor vertical fins 104 may extend along the y-axis beyond the semiconductor vertical fins 104. In illustrative embodiments, the bottom source/drain region 106 extends a greater distance on one longitudinal side of the semiconductor vertical fin 104 compared to the other longitudinal side of the semiconductor vertical fin 104. It is also envisioned that the bottom source/drain region 106 may extend the same length from either side of the semiconductor vertical fins 104.

FIGS. 2 and 3 also illustrate the formation of a shallow trench isolation (STI) regions 110-1, 110-2, 110-3 at least partially within the substrate 102 adjacent the fins 104. As depicted in FIG. 2, a shallow trench region 110-1 is formed on each lateral side of a pair of adjacent vertical fins 104 (only one shallow trench region is shown in FIG. 2) to electrically isolate adjacent pairs of vertical fins 104 extending along the x-axis. As depicted in FIG. 3, shallow trench isolation (STI) regions 110-2, 110-3 are formed on respective longitudinal ends of each vertical fin 104 to electrically isolate longitudinally spaced semiconductor vertical fins 104. In one illustrative embodiment, the STI regions 110-1, 110-2, 110-3 are formed by initially etching respective trenches 112 in the substrate 102. Each of the trenches 112 may have the same dimensions. A dielectric liner, for example an STI dielectric liner 114, is deposited on the surface of the substrate 102 including within the trenches 112 and on the semiconductor vertical fins 104. The STI dielectric liner 114 may include a silicon nitride material. An isolation or STI dielectric fill 116 including, for example, an oxide such as a silicon oxide liner, is deposited, via any conventional deposition process, on the substrate 102 to fill the trenches 112 and encapsulate the semiconductor vertical fins 104. Initially, the STI dielectric fill 116 may be subjected to a chemical mechanical polishing (CMP) process to planarize the STI dielectric fill 116 to be coplanar with the top of the semiconductor vertical fins 104. Subsequently, the STI dielectric fill 116 is removed via an etching process selective to the STI dielectric liner 114 to expose the semiconductor vertical fins 104 and reduce the STI dielectric fill 116 to a position above the STI dielectric liner 114 on the substrate 102 as shown in FIGS. 2 and 3. The STI dielectric fill 116 forms the STI isolation regions 110-1, 110-2, 110-3. The STI isolation regions 110-1, 110-2, 110-3 extend a predetermined distance vertically from the trenches 112 within the substrate 102 above or beyond the upper surface of the bottom source/drain regions 106.

With reference to FIGS. 4 and 5, a conformal sacrificial liner 118 is deposited relative to the substrate 102 to encapsulate the STI dielectric fill 116 and the semiconductor vertical fins 104, and to pinch off the spacings between the longitudinally adjacent pairs of semiconductor vertical fins 104. One suitable conformal sacrificial liner 118 is fabricated from titanium oxide (TiOx). The sacrificial liner 118 may be deposited using any known techniques including, for example, a plasma enhanced atomic layer deposition (PEALD) process, a plasma-enhanced chemical vapor deposition (PECVD) process, a physical vapor deposition (PVD) process, a chemical vapor deposition (CVD) process, an atomic layer deposition (ALD) process, etc. In illustrative embodiments, the sacrificial liner 118 is deposited via an atomic layer deposition (ALD) process, which allows for high conformality of the material of the dielectric liner 118.

With continued reference to FIGS. 4 and 5, the process is continued by depositing a sacrificial material, e.g., an organic planarization layer (OPL) 120, onto the semiconductor structure 100, particularly above the space occupied by the STI isolation regions 110-1, 110-2, 110-3. The organic planarization layer (OPL) 120 may be deposited from solution, e.g., by any conventional deposition process, and baked at high temperatures. The organic planarization layer (OPL) 120 can extend beyond the upper surfaces of the vertical fins 104. In some instances, the organic planarization layer (OPL) 120 is self-leveling and achieves planarization over the surface topography without the use of etching, chemical mechanical polishing (CMP), or other conventional planarization techniques. In other instances, the organic planarization layer (OPL) 120 may require multiple deposition processes, etching processes or optionally a CMP process to planarize the organic planarization layer (OPL) 120. The organic planarization layer (OPL) 120 may have a thickness ranging from about 50 nm to about 500 nm. The organic planarization layer (OPL) 120 is subjected to a conventional lithographic and etching processes utilizing, e.g., a reactive ion etching (RIE) process (with, e.g., a halogen-based plasma chemistry) selective to the material of the high-k liner to recess the organic planarization layer (OPL) 120 and expose at least the upper section of the dielectric liner 118.

Figure 6:
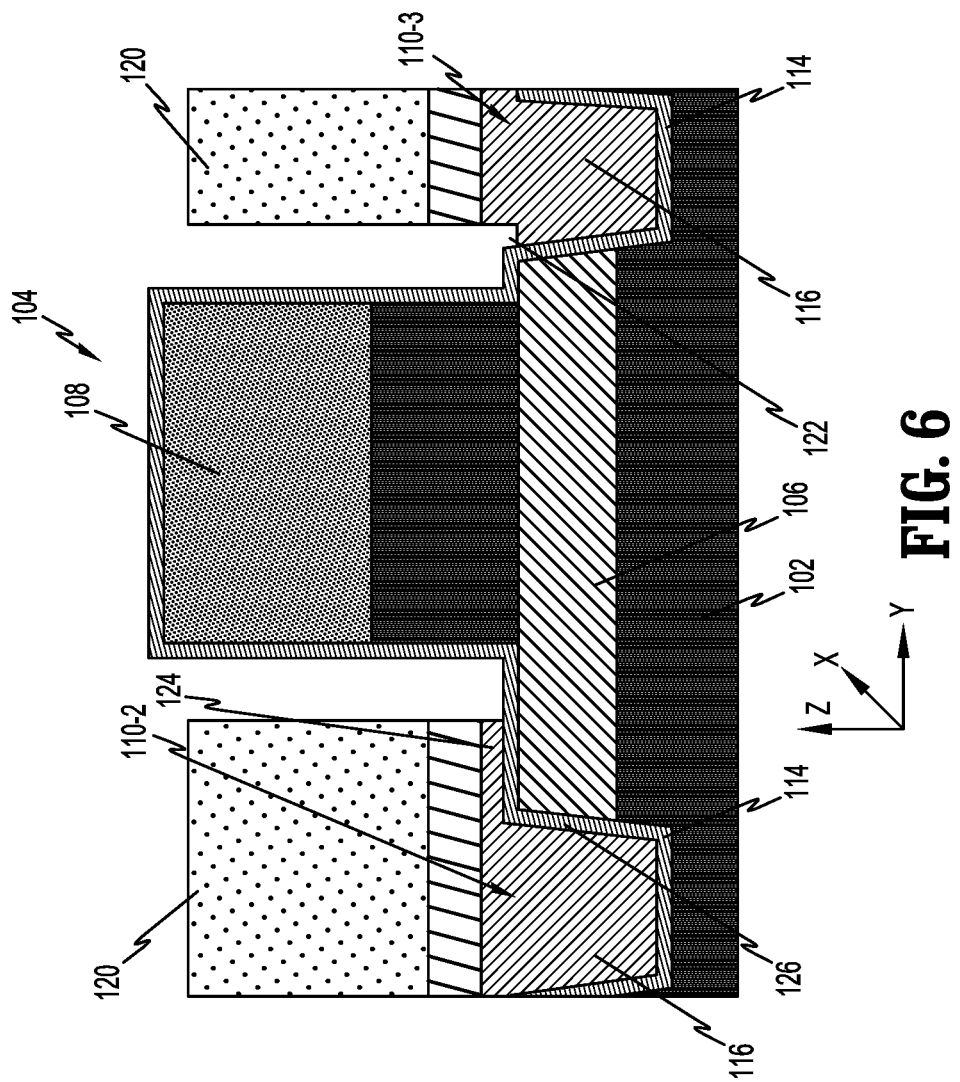
FIG. 6 is a cross-sectional view along the y-axis of the semiconductor structure at a third intermediate stage of fabrication of the semiconductor structure according to one or more illustrative embodiments.

Referring now to FIG. 6, the exposed sacrificial liner 118 is removed relative to the substrate 102 with the exception of the section of the sacrificial liner 118 beneath the sacrificial organic planarization layer (OPL) 120. In one methodology, a conventional etching process, e.g., reactive ion etching (RIE) (with, e.g., a halogen-based plasma chemistry) is utilized to remove the dielectric liner 118. The remaining exposed STI dielectric fill 116 is also removed with the exception of the material beneath the organic planarization layer (OPL) 120, i.e., above the STI isolation regions 110-1, 110-2, 110-3. As depicted in FIG. 6, upon removal of the sacrificial liner 118, a portion of the STI isolation region 110-3 adjacent one longitudinal end of the semiconductor vertical fin 104 is also removed to define a recessed segment 122 within the dielectric fill 116 of the STI isolation region 110-3 at this longitudinal end of the semiconductor vertical fin 104. Even further, the STI isolation region 110-2 adjacent the other longitudinal end of the vertical fin 104 includes an extended segment 124 of the STI dielectric fill 116, i.e., the segment beneath the sacrificial organic planarization layer (OPL) 120 and the sacrificial liner 118. Furthermore, a liner segment 126 of the STI dielectric liner 114 is disposed beneath the extended segment 124 of the STI isolation region 110-2.

Figure 7:
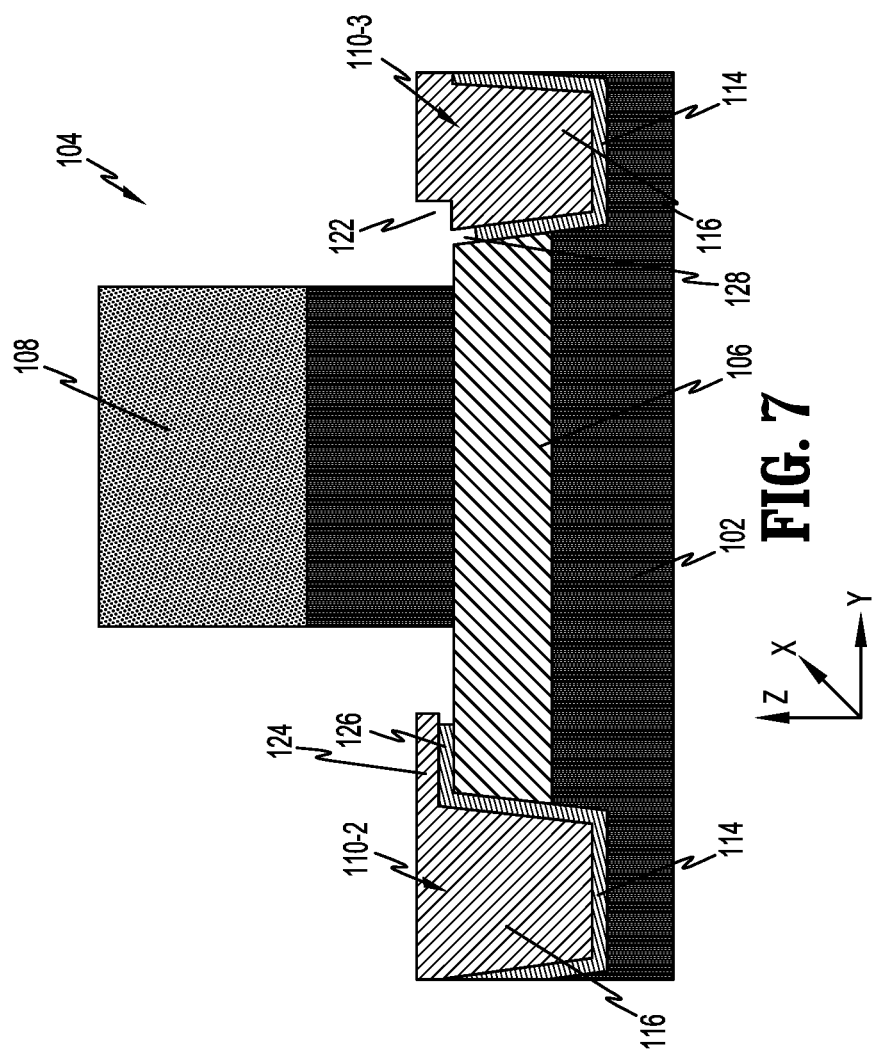
FIG. 7 is a cross-sectional view along the y-axis of the semiconductor structure at a fourth intermediate stage of fabrication of the semiconductor structure according to one or more illustrative embodiments.

Referring now to FIG. 7, the sacrificial organic planarization layer (OPL) 120 and the sacrificial liner 118 above the STI isolation regions 110-1, 110-2, 110-3 are removed through one or more suitable etching or removal processes including a wet etch. The organic planarization layer (OPL) 120 may be removed via an ash etching and/or stripping process. The etching material can be an $N_2/H_2$, or $CO/CO_2$ ash or a nitrogen or hydrogen-based chemistry including, for example, nitrogen gas or hydrogen gas, or a combination thereof. The sacrificial liner 118 may be removed via one or more etching processes leaving the semiconductor vertical fins 104, the bottom source/drain regions 106 and the STI isolation regions 110-1, 110-2, 110-3 unexposed on the semiconductor substrate 102. In addition, a portion of the STI dielectric liner 114 is removed adjacent the newly formed recess segment 122 to define a vertical gap 128 leading from the recessed segment 122.

Figure 8:
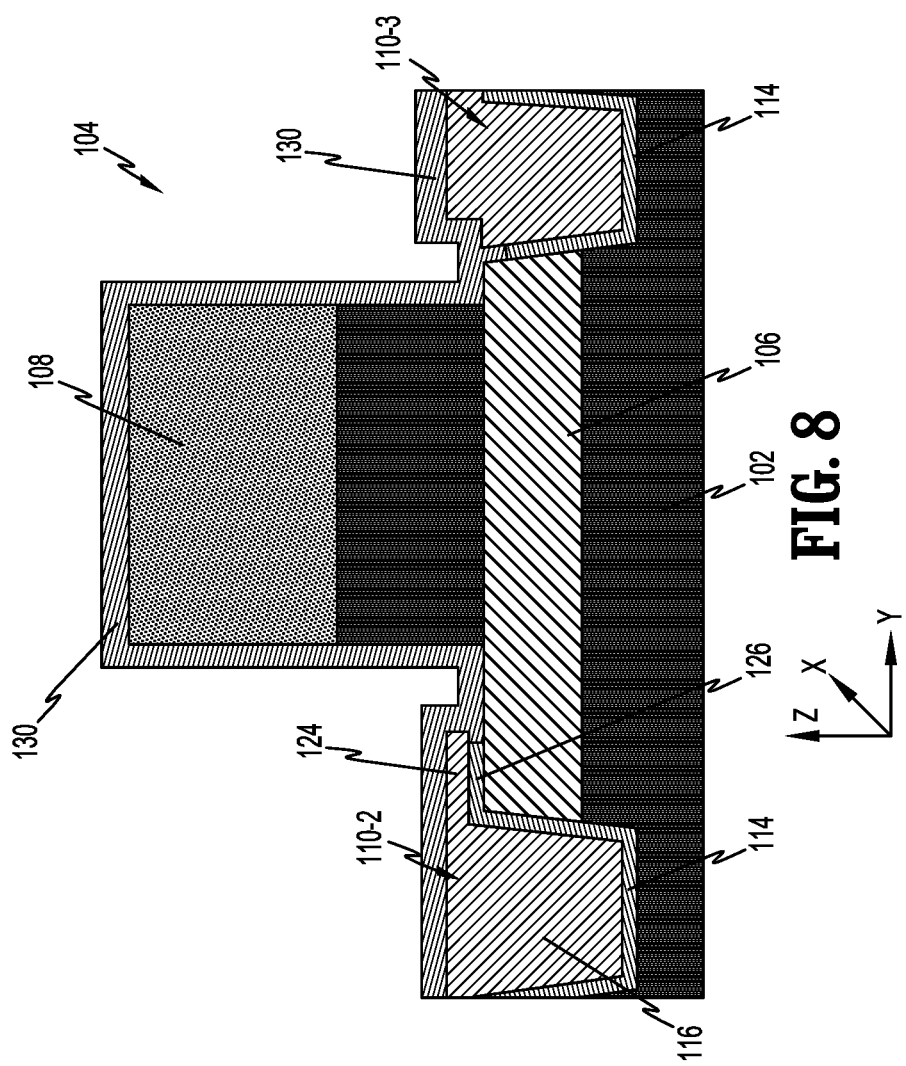
FIG. 8 is a cross-sectional view along the y-axis of the semiconductor structure at a fifth intermediate stage of fabrication of the semiconductor structure according to one or more illustrative embodiments.
Figure 9:
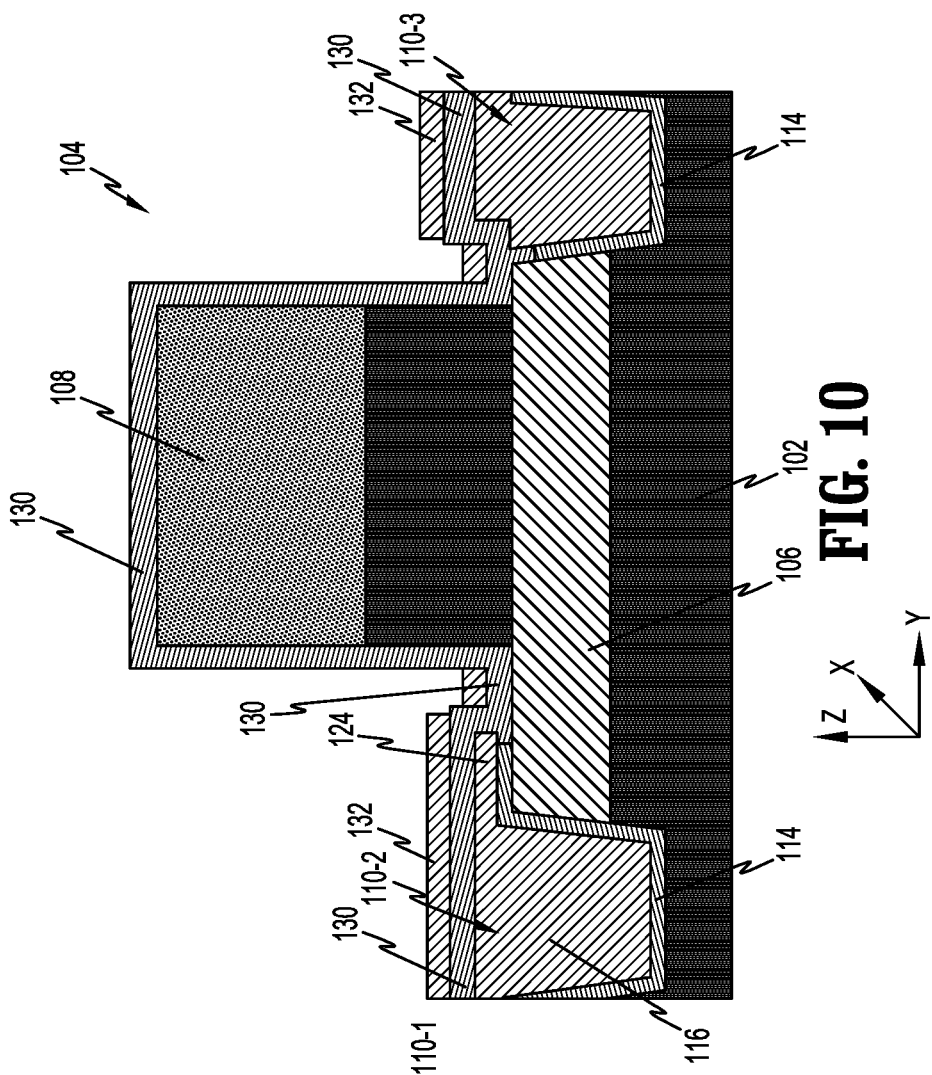
FIG. 9 is a cross-sectional view along the x-axis of the semiconductor structure at a sixth intermediate stage of fabrication of the semiconductor structure according to one or more illustrative embodiments.

With reference to FIG. 8, a bottom spacer 130 is deposited on the substrate 102 to cover the STI isolation regions 110-1, 110-2, 110-3, the vertical fins 104 and the bottom source/drain regions 106. FIG. 9 illustrates the bottom spacer 130 on the STI isolation region 110-1. The bottom spacer 130 may be made of any insulating material, such as an oxide and silicon nitride (SiN), silicon oxide ($SiO_2$), silicon oxynitrides SiOxNy, or a combination thereof, and may have a thickness ranging from 4 nanometers (nm) to approximately 15 nm, or between about 5 nm to about 10 nm. In one illustrative embodiment, the bottom spacer 130 comprises silicon nitride (SiN). The bottom spacer 130 may be formed by any method known in the art, including directional deposition techniques. The bottom spacer 130 fills the recessed segment 122 of the dielectric fill 116 of the STI isolation region 110-3 and the vertical gap 128 provided by removal a portion of the STI liner 114.

Figure 10:
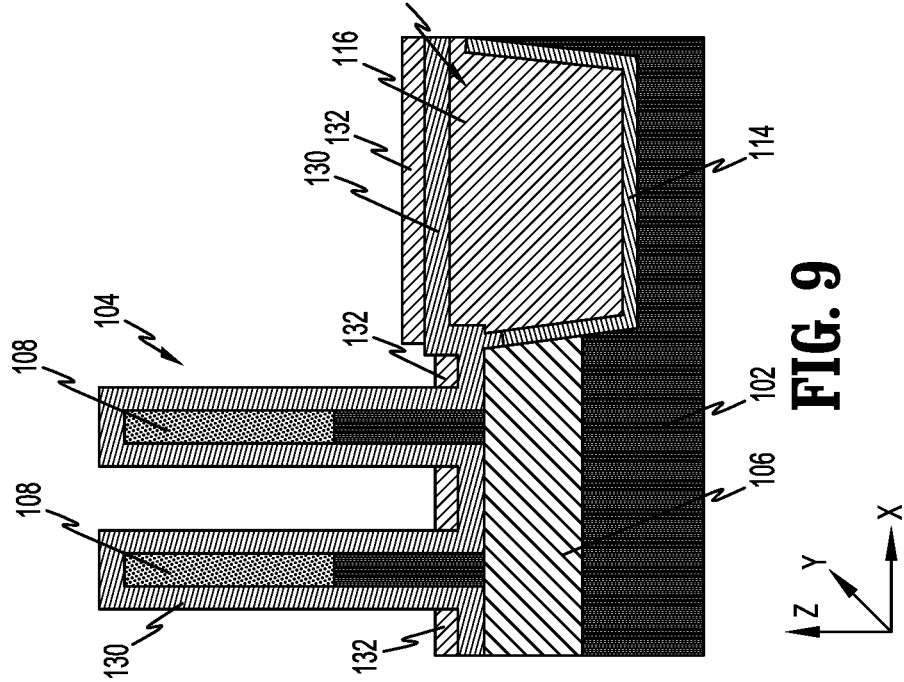
FIG. 10 is a cross-sectional view along the y-axis of the semiconductor structure at the sixth intermediate stage of fabrication according to one or more illustrative embodiments.

Referring now to FIGS. 9 and 10, a directional deposition process, such as (gas cluster ion beam (CCIB) deposition or cyclic deposition and etching processes using a high-density plasma (HDP) oxide deposition, is used to form layer 132 on the bottom spacer 130.

Figure 11:
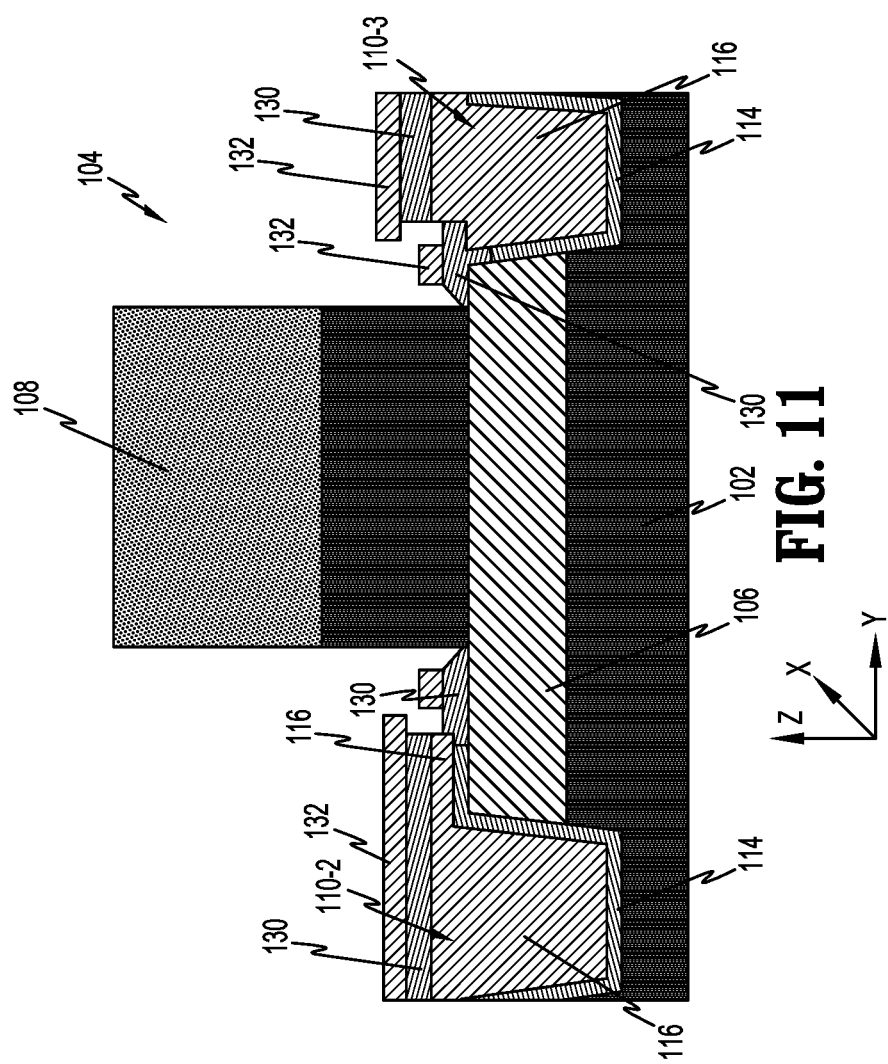
FIG. 11 is a cross-sectional view along the y-axis of the semiconductor structure at a seventh intermediate stage of fabrication of the semiconductor structure according to one or more illustrative embodiments.

With reference to FIG. 11, the exposed surfaces of the bottom spacer 130, i.e., not covered by the HDP deposition layer 132 are removed via a suitable etching process selective to the material of the HDP deposition layer 132. As shown, subsequent to the etching process, various bottom spacer segments of the bottom spacer 130 remain on the bottom source/drain regions 106.

Referring now to FIGS. 12-13, the HPD deposition layer 132 is removed via a conventional etching process selective to the material of the bottom spacer 130 leaving the bottom spacer 130, the STI isolation regions 110-1, 110-2, 110-3 and the bottom source/drain regions 106. More specifically a first segment 130a of the bottom spacer 130 remains in the recessed segment 122 of the STI isolation region 110-3 (FIG. 7) and a second segment 130b of the bottom spacer 126 is received within the vertical gap 128 leading from the recessed segment 122. The first and second segments 130a, 130b cover the longitudinal edge of the bottom source/drain region 106 adjacent the STI isolation region 110-3. A third segment 130c remains on the bottom source/drain region 106 on the other longitudinal side of the semiconductor vertical fin 106. The first segment 130a of the bottom spacer 130 and the third segment 130c may be in contacting relation with the vertical fin 104. As noted, the liner segment 114a of the STI dielectric liner 114 extends from the STI isolation region 110-2 onto the bottom source/drain region 106 and is continuous with the STI dielectric liner 114 extending vertically within the STI isolation region 110-2 to cover the edge of the bottom source/drain 106 adjacent the STI isolation region 110-2.

As best depicted in FIG. 13, the upper edges of the bottom source/drain regions 106 are covered on one longitudinal end adjacent the STI isolation region 110-2 by the vertical segment of the liner 114, the horizontal liner segment 114a, the bottom segment 130c of the bottom spacer 130 and the extended segment 124 of the STI dielectric fill 116. The other longitudinal edge of the bottom source/drain region 106 adjacent the STI isolation region 110-3 is covered by the bottom spacer segments 130a, 130b, and optionally a vertical segment of the liner 114 leading to the bottom spacer segment 130b. These arrangements substantially reduce parasitic capacitance over the STI region 110-3 between the gate metal and the bottom source/drain region 106, which will be shown later.

Referring now to FIGS. 14 and 15, the process is continued by removing the fin caps 108 from the semiconductor vertical fins 104 via a conventional etching process. Thereafter, a top spacer 134 is formed on each of the semiconductor vertical fins 104. The top spacer 134 may comprise silicon nitride (SiN), silicon oxycarbonitride (SiOCN), or boron-modified silicon carbonitride (SiBCN). The top spacer 134 may be deposited via any of the aforementioned directional deposition techniques. Thereafter, the top source/drain regions 136 may be formed sequentially on the top spacer 134. For example, the top source/drain regions 136 may include one or more epitaxial layers formed via epitaxial growth processes or be formed by incorporating N-type and P-type dopants as described hereinabove in connection with the bottom source/drain regions 106. The top source/drain regions 136 may be n-doped and/or p-doped. A dielectric material such as silicon nitride (SiN) and/or silicon oxide (SiO2) may be deposited onto the top source/drain regions 136 via known deposition processes, and the dielectric material is subjected to a CMP process to form an epi-cap (not shown) on each of the top source/drain regions 136.

One or more high-k metal gate structures 138 including, e.g., a conformal high-k liner and a work function metal may be deposited onto the semiconductor structure 100. The high-k liner may be formed by depositing one or more conformal layers of dielectric material over the surface of the semiconductor structure 100. The high-k liner may comprise a high-k dielectric material having a dielectric constant of about 3.9 or greater. In illustrative embodiments, the high-k liner includes, but is not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k liner may further include dopants such as lanthanum, aluminum. In one embodiment of the disclosure, the conformal high-k liner is formed with a thickness in a range of about 0.5 nm to about 2.5 nm, which will vary depending on the target application. The high-k liner is deposited using known methods such as atomic layer deposition (ALD), e.g., which allows for high conformality of the gate dielectric material.

The work function metal may be deposited onto the semiconductor structure 100, i.e., within or over the high-k liner to form a functional gate structure. The work function metal may be formed by depositing a conductive material including, but not limited to titanium nitride (TiN), titanium aluminum nitride (TiAlN) and/or combinations thereof. Other suitable materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. In embodiments, the work function metal includes one or more of TiN, TiAlC or combinations thereof. The first work function metal may further comprise dopants that are incorporated during or after deposition. The work function metal is deposited using a suitable deposition process, e.g., CVD, plasma-enhanced chemical vapor deposition (PECVD), PVD, plating, thermal or e-beam evaporation, sputtering, etc.

Following the formation of the semiconductor structure 100 shown in FIGS. 14-15, any known sequence of processing steps can be implemented to complete the fabrication of the VFET device, the details of which are not needed to understand embodiments of the disclosure. Briefly, by way of example, an interlayer dielectric 140 is deposited on the semiconductor structure 100. Thereafter, using, e.g., known lithographic and etching processes, via openings are formed in a known manner. The via openings are filled with conductive material to form the gate contacts 142 as depicted in FIGS. 14-15. Following formation of the gate contacts 142, a BEOL (back end of line) interconnect structure is formed to provide connections to/between the VFET devices and other active or passive devices that are formed as part of the FEOL layer.

As best depicted in FIGS. 14-15, the bottom spacer 130 including the bottom spacer segments 130a, 130b isolate the bottom source/drain regions 106 and the STI isolation regions 110-1. 110-3. The extended segment 124 of the STI dielectric fill 116 and the remaining segment of the extended liner 114a cover the respective edges of the bottom source/drain region 106 between the STI regions 110-2, 110-3. This configuration forms a thin bottom spacer near the channel region, and establishes a thicker dielectric fill 116 coverage which is away from the channel region, which optimizes both device junction resistance and parasitic capacitance between any gate metal disposed over the STI regions 110-1, 110-2, 110-3 and bottom source/drain region 106 of epi-material.

It is to be understood that the methods discussed herein for fabricating VFET devices with uniform structural profiles can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing the disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the disclosure provided herein, one of ordinary skill in the art will be able to contemplate other implementations and applications of the techniques of the disclosure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

The invention claimed is:

1. A semiconductor structure, comprising:
   a substrate defining a longitudinal axis and a vertical axis orthogonal to the longitudinal axis;
   at least one semiconductor vertical fin extending from the substrate;
   a bottom source/drain region disposed beneath the at least one semiconductor vertical fin;
   first and second isolation regions on respective longitudinal sides of the at least one vertical fin, each of the first and second isolation regions extending vertically above the bottom source/drain region;
   a bottom spacer disposed on the first and second isolation regions, a first spacer segment of the bottom spacer being disposed on an upper surface portion of the bottom source/drain region adjacent the first isolation region;
   a dielectric liner underlying at least portions of the first and second isolation regions, wherein a liner segment of the dielectric liner is disposed on a second upper surface portion of the bottom source/drain region adjacent the second isolation region; and
   a functional gate structure located on each longitudinal side of the at least one vertical fin.

2. The semiconductor structure of claim 1 wherein the first isolation region includes a recessed section, the first spacer segment of the bottom spacer at least partially disposed within the recessed section of the first isolation region.

3. The semiconductor structure of claim 2 wherein the first spacer segment of the bottom spacer is configured to extend from the recessed section of the first isolation region to the at least one vertical fin.

4. The semiconductor structure of claim 1 wherein the functional gate structure is disposed on the bottom spacer.

5. The semiconductor structure of claim 1 including a top spacer on each functional gate structure and contacting sidewall portions of the at least one vertical fin.

6. The semiconductor structure of claim 5 including a top source/drain region disposed on the at least one vertical fin and contacting the top spacer.

7. The semiconductor structure of claim 2 including a second spacer segment of the bottom spacer adjacent the first isolation region, the second spacer segment extending below the first upper surface portion of the bottom source/drain region.

8. The semiconductor structure of claim 7 wherein the first spacer segment and the second spacer segment of the bottom spacer are in contacting engagement.

9. The semiconductor structure of claim 8 wherein the first spacer segment and the second spacer segment of the bottom spacer are monolithically formed.

10. The semiconductor structure of claim 7 wherein the first spacer segment of the bottom spacer is configured to taper to define a decreased height adjacent the at least one vertical fin.

11. The semiconductor structure of claim 2 including a third spacer segment of the bottom spacer disposed on the upper surface portion of the bottom source/drain region adjacent the second isolation region.

12. The semiconductor structure of claim 11 wherein the third spacer segment of the bottom spacer is configured to extend to the at least one vertical fin.

13. The semiconductor structure of claim 12 wherein the third spacer segment is configured to taper to define a decreased height adjacent the at least one vertical fin.

14. The semiconductor structure of claim 1 wherein the bottom spacer comprises silicon nitride.

15. The semiconductor structure of claim 1 wherein the second isolation region includes an extended isolation segment disposed between the liner segment adjacent the second isolation region and the bottom spacer.

16. A semiconductor structure, comprising:
   a substrate defining a longitudinal axis and a vertical axis orthogonal to the longitudinal axis;
   at least one semiconductor vertical fin extending from the substrate;
   bottom and top source/drain regions disposed respectively beneath and above the at least one vertical fin;
   first and second isolation regions on respective longitudinal sides of the at least one vertical fin;
   a dielectric liner underlying at least portions of each of the first and second isolation regions; and
   a bottom spacer disposed on at least portions of the first and second isolation regions, the bottom spacer including a vertical spacer segment extending vertically with respect to the vertical axis from the dielectric liner underlying the first isolation region and a horizontal spacer segment extending longitudinally with respect to the longitudinal axis on the bottom source drain region to contact the at least one vertical fin; and wherein the horizontal spacer segment is further configured to be received within a recess of the first isolation region to thereby also extend longitudinally with respect to the longitudinal axis away from the at least one vertical fin.

17. The semiconductor structure of claim 16 wherein the dielectric liner includes a liner segment adjacent the second isolation region and extending longitudinally with respect to the longitudinal axis on the upper surface of the bottom source/drain region from the second isolation region toward the at least one vertical fin.

18. The semiconductor structure of claim 17 wherein the second isolation region includes an extended isolation segment disposed between the liner segment of the dielectric liner and the bottom spacer.

19. The semiconductor structure of claim 16 wherein the horizontal spacer segment of the bottom spacer is configured to taper to define a decreased height adjacent the at least one vertical fin.

20. The semiconductor structure of claim 16 including a second horizontal spacer segment of the bottom spacer disposed on the bottom source/drain region adjacent the second isolation region and configured to extend to the at least one vertical fin.

* * * * *